United States Patent [19]
Fujii

[11] Patent Number: 5,537,076
[45] Date of Patent: Jul. 16, 1996

[54] NEGATIVE RESISTANCE CIRCUIT AND INVERTER CIRCUIT INCLUDING THE SAME

[75] Inventor: Masahiro Fujii, Tokyo, Japan

[73] Assignee: NEC Corporation, Tokyo, Japan

[21] Appl. No.: 235,877

[22] Filed: May 2, 1994

[30] Foreign Application Priority Data

May 25, 1993 [JP] Japan ..................................... 5-122227

[51] Int. Cl.⁶ .................................................. H03K 19/02
[52] U.S. Cl. .......................... 327/568; 327/397; 327/209; 326/135
[58] Field of Search .................................... 327/108, 109, 327/110, 111, 112, 205, 568, 309, 374, 375, 402, 207, 208, 209; 326/119, 36, 120, 121, 135

[56] References Cited

U.S. PATENT DOCUMENTS

| | | | |
|---|---|---|---|
| 3,700,981 | 10/1972 | Masuhara et al. | 326/120 |
| 4,117,353 | 9/1978 | Butler et al. | 327/108 |
| 4,575,859 | 3/1986 | Ollendick | 327/309 |
| 4,682,051 | 7/1987 | Arakawa | 327/208 |
| 4,709,168 | 11/1987 | Kamuro et al. | 326/120 |
| 4,764,897 | 8/1988 | Kameyama et al. | 327/208 |
| 4,956,691 | 9/1990 | Culley et al. | 327/108 |
| 5,281,862 | 1/1994 | Ma | 327/108 |

FOREIGN PATENT DOCUMENTS 158693 12/1989 Japan .

OTHER PUBLICATIONS

Sekine et al.; "Multistable Circuit Using Λ-Shaped Negative Resistance Devices and Its Application to Frequency Divider"; The Transactions of The Institute of Electronics, Information and Communication Engineers, vol. J68–C, pp. 43–50. Jan., 1985.

Primary Examiner—Timothy P. Callahan
Assistant Examiner—Jung Ho Kim
Attorney, Agent, or Firm—Whitham, Curtis, Whitham & McGinn

[57] ABSTRACT

A new negative resistance circuit comprises a first N-channel enhancement FET (E-FET), an N-channel depletion FET as a load element connected to the first N-channel E-FET to form a series branch connected between negative resistance ports, and a second N-channel E-FET having source-drain path parallel to the series branch. The gate of the second N-channel E-FET is connected to the connection node between the load element and the first E-FET, while the gate electrode of the first E-FET is connected to a control port for controlling current-voltage characteristic between the negative resistance ports. The negative resistance circuit can be used in an inverter to enable the inverter to have a hysteretic function or a multivalued logic function.

14 Claims, 4 Drawing Sheets

NEGATIVE RESISTANCE CIRCUIT AND INVERTER CIRCUIT INCLUDING THE SAME

BACKGROUND OF THE INVENTION (a) Field of the Invention

The present invention relates to a negative resistance circuit, and more particularly, to a negative resistance circuit composed of a plurality of field effect transistors (FETs) and suitable for integration into IC chips.

(b) Description of Related Art

Over the years, various negative resistance devices from Esaki diodes to resonant tunneling diodes have been developed. If a negative resistance circuit including such a negative resistance device was used for memory circuits or flip-flop circuits integrated in IC chips, the number of elements in these circuits could be reduced, thereby enabling to make these circuits smaller. Such negative resistance circuits would in turn facilitate implementation of multivalued logic circuits, which could be used to form various circuits having new functions.

Negative resistance devices as mentioned above, however, have not been actually used in IC chips, because the process for manufacturing negative resistance devices differs from that of bipolar transistors or FETs integrated in the IC chips. Additionally, resonant tunneling diodes have a difficulty in obtaining a negative resistance characteristic operable at room temperature. An attempt has been made to obtain a circuit having a negative resistance characteristic by using therein semiconductor elements of bipolar transistors or FETs without a negative resistance device. An example of such a circuit is described in "The Transactions of The Institute of Electronics, Information and Communication Engineers", vol. J68-C, p.43, January, 1985.

Referring to FIG. 1A, the negative resistance circuit described in the above document has a structure in which a P-channel depletion FET 15 and an N-channel depletion FET 16 are connected in series between negative resistance ports 20 and 30 of the negative resistance circuit, with their drains connected with each other. The gate electrode of each one of the depletion FETs 15 and 16 is connected to the source electrode of the other of the FETs 15 and 16. When a supply voltage applied between the negative resistance ports 20 and 30 is close to zero, both the P-channel depletion FET 15 and the N-channel depletion FET 16 are in ON states.

If the supply voltage applied between the negative resistance ports 20 and 30 is gradually increased, the gate-source voltage of the P-channel depletion FET 15 becomes negative while the gate-source voltage of the N-channel depletion FET 16 becomes positive, so that the drain current flowing through both the P- and N-channel depletion FETs 15 and 16 decreases. Due to this function, the circuit of FIG. 1A exhibits a negative resistance characteristic in which current flowing between the negative resistance ports 20 and 30 decreases when the supply voltage increases between the negative resistance ports 20 and 30.

Depletion FETs are generally used for implementing a negative resistance circuit. However, enhancement FETs can be used in negative resistance circuit, as disclosed in Japanese Patent Laid-Open Publication No. 1(1989)-58693. Referring to FIG. 1B, the negative resistance circuit of this type comprises a P-channel FET 17 and an N-channel FET 18, and the N-well of the P-channel FET 17 is connected to the drain electrode of the N-channel FET 18, while the P-well of the N-channel FET 18 is connected to the drain electrode of the P-channel FET 17. The source electrode and the gate electrode of the P-channel FET 17 are connected to a first negative resistance port 20 and a first control port 50, respectively, while the source electrode and the gate electrode of the N-channel FET 18 are connected to a second negative resistance port 30 and a second control port 60, respectively.

In the negative resistance circuit shown in FIG. 1B, a control voltage is supplied to the second control port 60 relative to the second negative resistance port 30. The level of the control voltage is maintained between a first threshold voltage of the N-channel FET 18 in the state where the electric potential at the P-well of the N-channel FET 18 is equal to that of the source electrode of the N-channel FET 18 and a second threshold voltage of the N-channel FET 18 in the state where the electric potential at the P-well of the N-channel FET 18 is lower than that of the source electrode of the N-channel FET 18.

Another control voltage is supplied to the first control port 50 relative to the second negative resistance port 30. The level of this control voltage is maintained between a first threshold voltage of the P-channel FET 17 in the state where the electric potential at the N-well of the P-channel FET 17 is equal to that of the source electrode of the P-channel FET 17 and a second threshold voltage of the P-channel FET 17 in the state where the electric potential at the N-well of the P-channel FET 17 is higher than that of the source electrode of the P-channel FET 17.

In order to shift the negative resistance circuit of FIG. 1B from an OFF state to an ON state, at least one of the FETs 17 and 18 is turned on by adjusting one or both of the control voltages supplied to the first and second control ports 50 and 60. Also, the circuit can be turned ON by increasing the voltage supplied between the first and second negative resistance ports 20 and 30 by such an amount that makes it possible that the drain-source voltage of one of the FETs 17 and 18 exceeds its breakdown voltage and lets the drain current of the one of the FETs flow into the well of the other of the FETs.

In order to shift the circuit of FIG. 1B from an ON state to an OFF state, the current flowing between the negative resistance ports 20 and 30 is reduced to zero by reducing the voltage between the negative resistance ports 20 and 30 down to zero, or one or both of the FETs 17 and 18 is turned off by adjusting one or both of the control voltages supplied to the control ports 50 and 60.

With the conventional negative resistance circuits as described above, there is a drawback in that the entire circuits cannot be formed of FETs of the same conductivity type, which means that a negative resistance circuit cannot be formed in an IC chip of an N-channel MOSFET, an ECL (emitter coupled logic) or a DCFL (direct coupled field effect transistor logic) including a GaAs (gallium arsenic) FET all formed of semiconductor elements of a single conductivity type.

SUMMARY OF THE INVENTION

In view of the foregoing, it is an object of the present invention to provide a new negative resistance circuit which can be formed of FETs of a single conductivity type.

It is another object of the present invention to provide an inverter circuit having a hysteretic function by using a negative resistance characteristic of the negative resistance circuit as described above.

In accordance with the present invention, there is provided a negative resistance circuit comprising: a first and a second transistors each having first and a second electrodes and control electrode controlling current flowing between the first and second electrodes, the conductivity type of the first transistor being the same as the conductivity type of the second transistor; and a load element connected to the second electrode of the first transistor to form a first branch connected between first and second ports of the negative resistance circuit, the second transistor being connected between the first and second ports to form a second branch parallel to the first branch, the control electrode of the second transistor being connected to the second electrode of the first transistor.

The new negative resistance circuit according to the present invention can be formed of two FETs of the same conductivity type and a single load element which may be formed of the same conductivity type as that of the FETs, so that the negative resistance circuit according to the present invention can be integrated into IC chips including only semiconductor elements of a single conductivity type, such as NMOSFET, GaAsFET and ECL circuits. By using the negative resistance circuit according to the present invention in IC chips such as memory cells, flip-flops and multivalued logic circuits, the IC chips can be formed with a reduced number of elements as compared to a conventional IC chips having no negative resistance circuit.

BRIEF DESCRIPTION OF THE DRAWINGS

The above and further objects as well as features and advantages of the present invention will be more apparent from the following description taken in conjunction with the accompanying drawings which.

DESCRIPTION OF THE PREFERRED EMBODIMENTS

Preferred embodiments of the present invention will now be described with reference to the drawings.

Figure 1A:
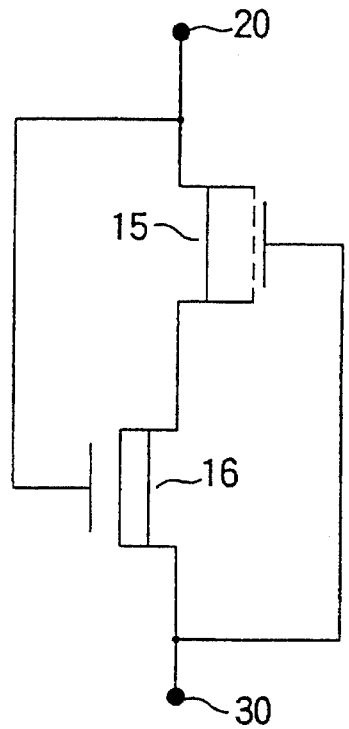
FIG. 1A is a circuit diagram showing a conventional negative resistance circuit.
Figure 1B:
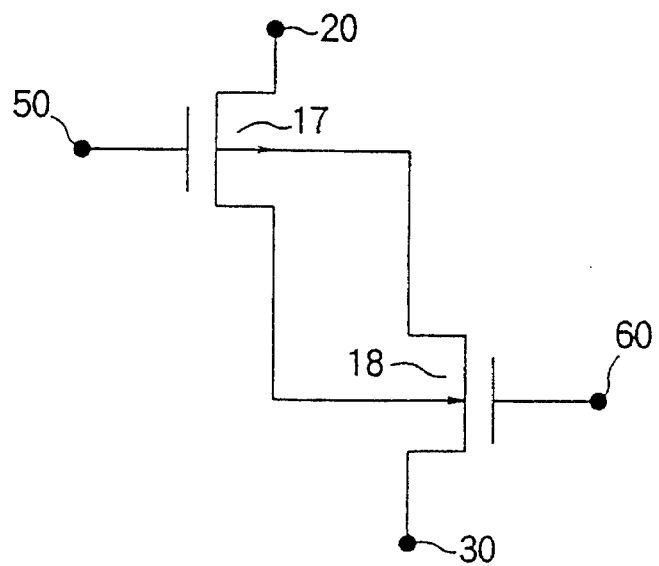
FIG. 1B is a circuit diagram showing another conventional negative resistance circuit.
Figure 2:
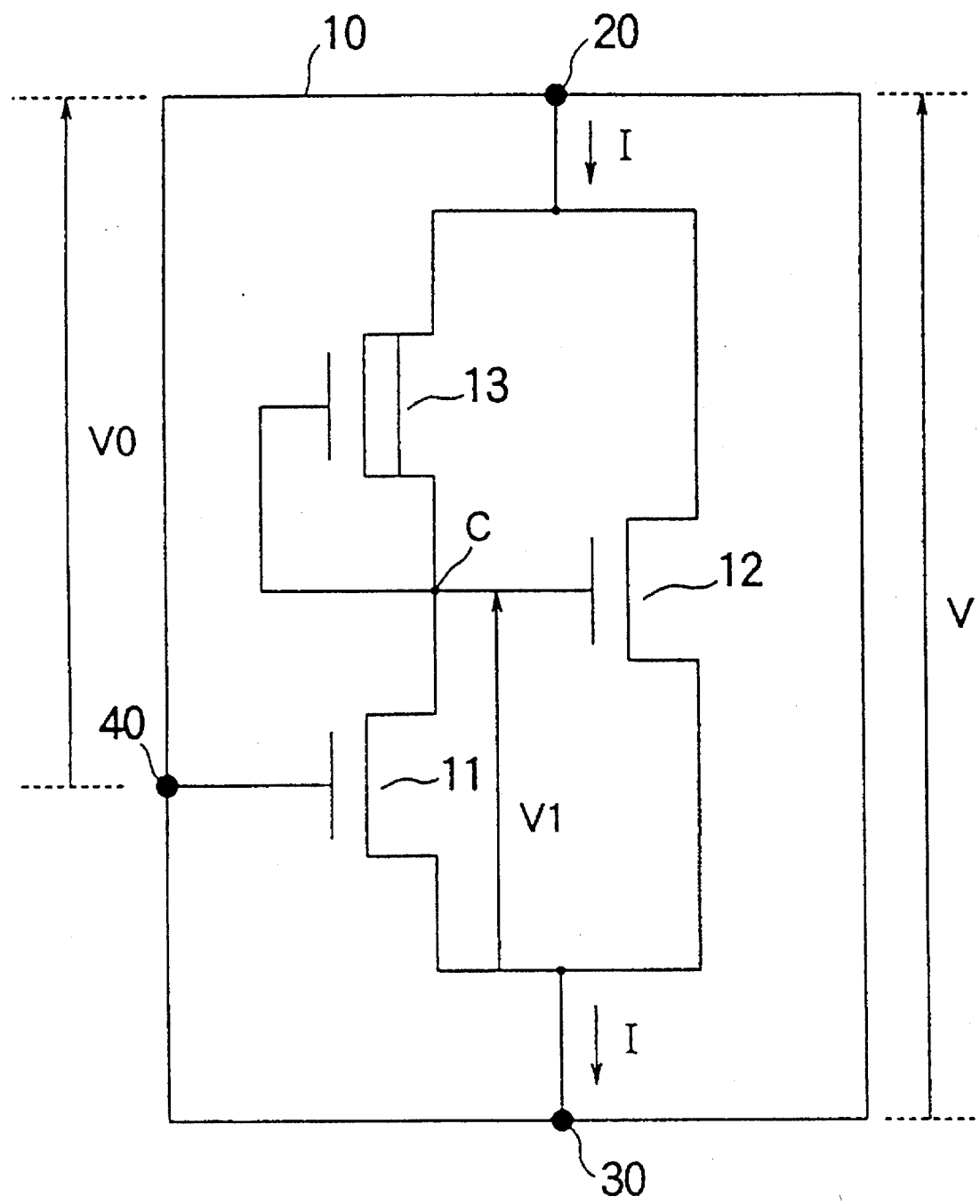
FIG. 2 is a circuit diagram showing a negative resistance circuit according to a first embodiment of the present invention.

Referring to FIG. 2, there is shown a negative resistance circuit according to a first embodiment of the present invention. As shown in the drawing, the negative resistance circuit generally designated at 10 comprises a first N-channel enhancement FET (E-FET) 11, a second N-channel E-FET 12, an N-channel depletion FET (D-FET) 13 serving as a load element of the first N-channel E-FET 11, and three external ports or nodes including first and second negative resistance ports 20, 30 and a control port 40. Each of the external ports is connected to an external circuit outside the negative resistance circuit 10. A supply voltage V is applied to the first negative resistance port 20 relative to the second resistance port 30, while a control signal voltage V0 is applied to the first negative resistance port 20 relative to the control port 40.

The drain electrode of the N-channel load D-FET 13 is connected to the first negative resistance port 20, and the source electrode thereof is connected to the drain electrode of the N-channel E-FET 11, the source electrode of which is connected to the negative resistance port 30, so that a series branch is formed between negative resistance ports 20 and 30. Parallel to the series branch, the second N-channel E-FET 12 is connected between the negative resistance ports 20 and 30 as a second branch, with the drain electrode and source electrode of the N-channel E-FET 12 being connected to the first and second negative resistance ports 20 and 30, respectively. The gate electrode of the first N-channel E-FET 11 is connected to the control port 40, while the gate electrode of the second N-channel E-FET 12 is connected to the connection node C connecting both the drains of the N-channel D-FET 13 and the N-channel E-FET 11.

Figure 3:
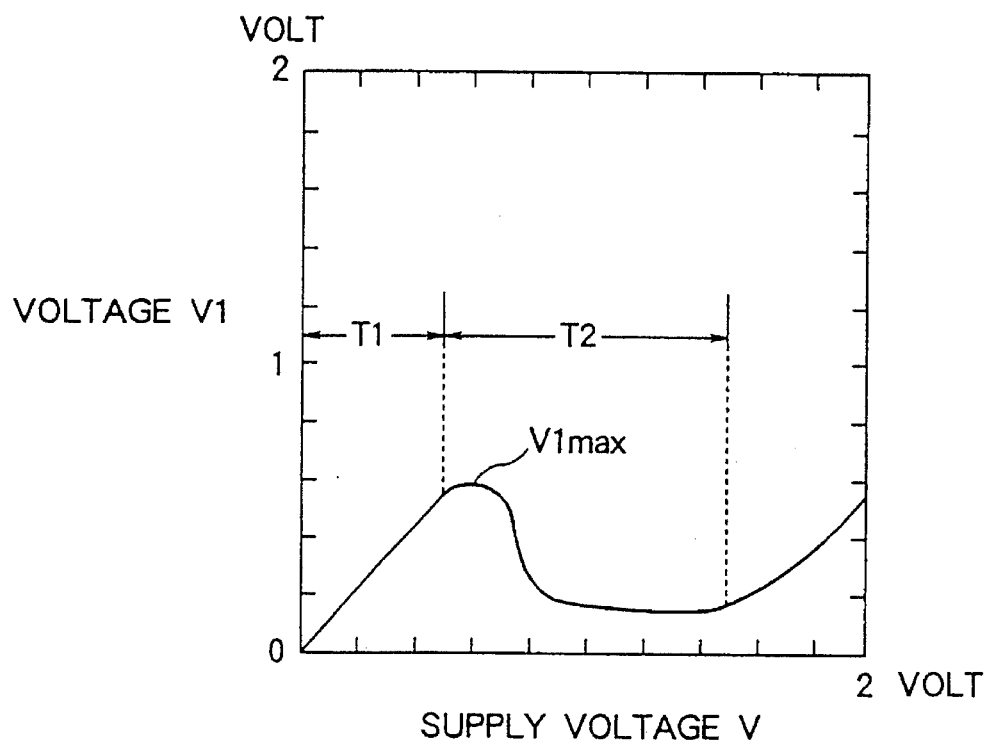
FIG. 3 is a graph showing a voltage-voltage characteristic in the negative resistance circuit of FIG. 2, in which voltage V1 at a connection node between FETs is shown as a function of supply voltage V.
Figure 4:
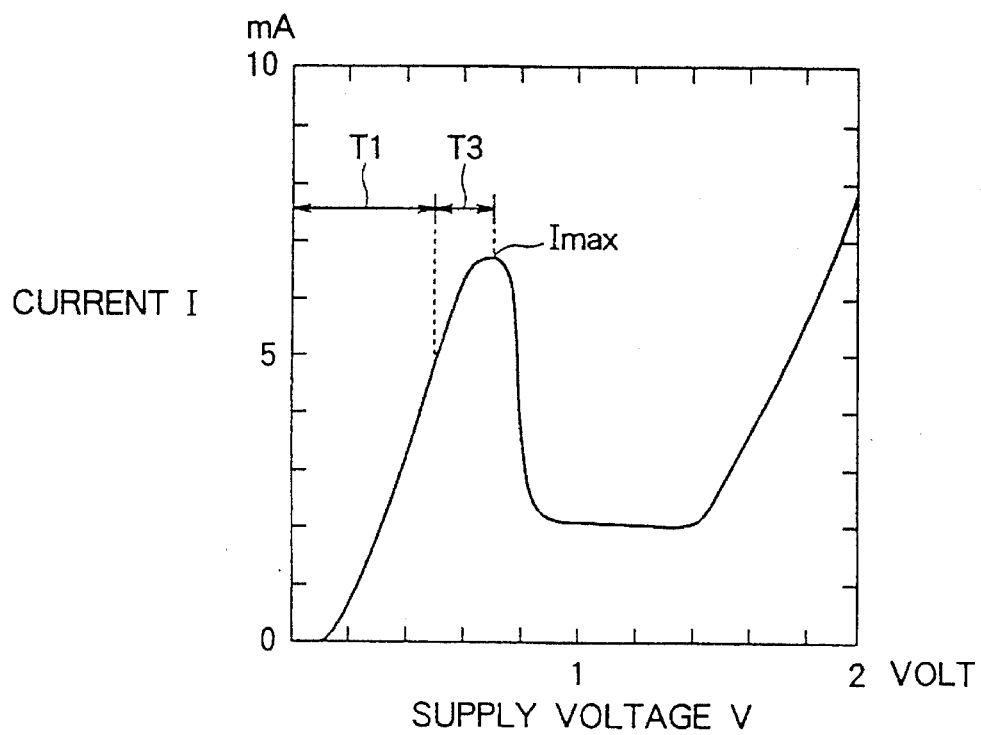
FIG. 4 is a graph showing a current-voltage characteristic between the negative resistance ports in the negative resistance circuit of FIG. 2.

Referring to FIG. 3 and FIG. 4, there are shown a voltage-voltage characteristic and a current-voltage characteristic in the negative resistance circuit of FIG. 2. FIG. 3 shows voltage V1 at the connection node C relative to the second negative resistance port 30 as a function of supply voltage V, while FIG. 4 shows Current I passing through the negative resistance circuit as a function of supply voltage V.

When supply voltage V gradually increases from zero volts to a certain high level in a range T1, voltage V1 at the junction node C increases, as shown in FIG. 3. Since the E-FET 11 is in an OFF state at this voltage range, voltage V1 is equal to supply voltage V. In the case where the threshold voltage of the E-FET 11 is Vt1, when voltage V exceeds a voltage V0+Vt1, voltage V1 exceeds the threshold voltage Vt1. Accordingly, drain current starts to flow through the E-FET 11 so that voltage V1 at the gate electrode of the E-FET 12 decreases in the voltage range T2 as shown in FIG. 3. Voltage V1 reaches a maximum value V1max at a certain voltage level of supply voltage V slightly higher than the voltage V0+Vt1 in the range T2.

The threshold voltage Vt2 of the E-FET 12 is set lower than the maximum level of voltage V1, so that the drain current of E-FET 12 has a maximum value around the voltage level V1max of voltage V1. The gate width of the E-FET 12 is designed or voltage V1 is determined so that the current Flowing through the E-FET 12 is larger than the current Flowing through the E-FET 11 when control voltage V0 reaches its maximum level. Accordingly, as shown in FIG. 4, Current I flowing from the first negative resistance port 20 to the second negative resistance port 30 increases with the increase of voltage V1 in the range T1 and T3, and reaches the maximum level Imax at the end of the range T3 when voltage V1 is approximately equal to the maximum level V1max. As a result, a negative resistance characteristic can be obtained as demonstrated in FIG. 4.

FIGS. 3 and 4 were actually obtained by selecting configurations of the FETs and the voltage conditions in the circuit as follows: the threshold voltages of E-FETs 11 and 12 were 0.1 V and the threshold voltage of D-FET 13 was −0.4 V; the gate widths of E-FET 11, E-FET 12 and D-FET 13 were 5 µm, 20 µm and 3.5 µm, respectively; and control voltage V0 was adjusted at 0.4 V. As is clearly demonstrated by these characteristic curves in FIGS. 3 and 4, a negative resistance characteristic was obtained in the voltage range between 0.7 and 0.9 volt of supply voltage V, which is above the voltage range T3.

Although the D-FET 13 having a gate and a source electrodes connected with each other was used as a load element for the E-FET 11 in the above embodiment, a similar negative resistance characteristic can be obtained in case where a resistor element such as a polysilicon resistor element is used instead of the load D-FET 13. Since it is possible that the threshold voltage Vt2 of the E-FET 12 can be made lower than the voltage V0+V1, a depletion FET having a negative threshold voltage can be used instead of the E-FET 12. Further, similar negative resistance circuits can be formed by using bipolar transistors.

Next, an inverter circuit according to a second embodiment of the present invention will be described with reference to FIGS. 5 and 6. The inverter circuit, having a hysteretic function generally designated at 100 in FIG. 5, includes the negative resistance circuit 10 of FIG. 2 and a third N-channel E-FET 14 having a drain electrode connected to the second negative resistance port 30 of the negative resistance circuit 10 and a source electrode connected to a ground line. The inverter circuit 100 also comprises a source supply terminal (node) 200 connected to the first negative resistance port 20 of the negative resistance circuit 10 for Vdd voltage source, a control terminal 400 connected to the control port 40 of the negative resistance circuit 10, an input terminal 500 connected to the gate of the third E-FET 14 and an output terminal 300 connected to the second negative resistance port 30 and to the drain of the third E-FET 14.

Figure 5:
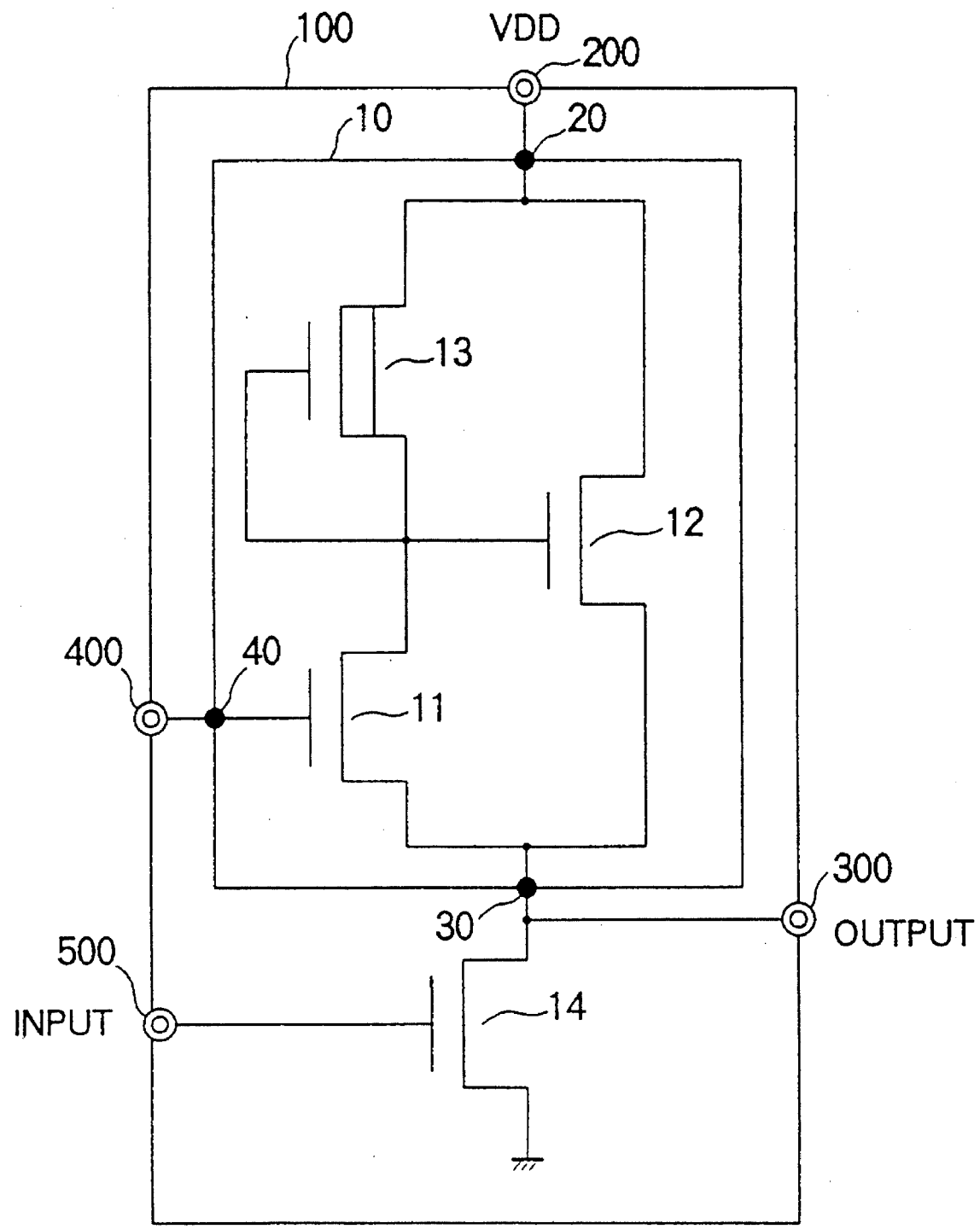
FIG. 5 is a circuit diagram showing an inverter circuit including the negative resistance circuit of FIG. 2, according to a second embodiment of the present invention.

In FIG. 5, a control voltage VO is fed between the source supply terminal 200 maintained at Vdd potential and the control terminal 400. In this embodiment, the configurations of the FETs and the voltage conditions of the circuit were selected as follows: the threshold voltages of E-FETs 11, 12 and 14 were 0.1 V and the threshold voltage of D-FET 13 was −0.4 V; the gate widths of E-FET 11, E-FET 12, E-FET 14 and D-FET 13 were 5 µm, 20 µm, 30 µm and 3.5 µm, respectively; and control voltage VO was adjusted at 0.4 V while the Vdd potential was set at 2 V.

Figure 6:
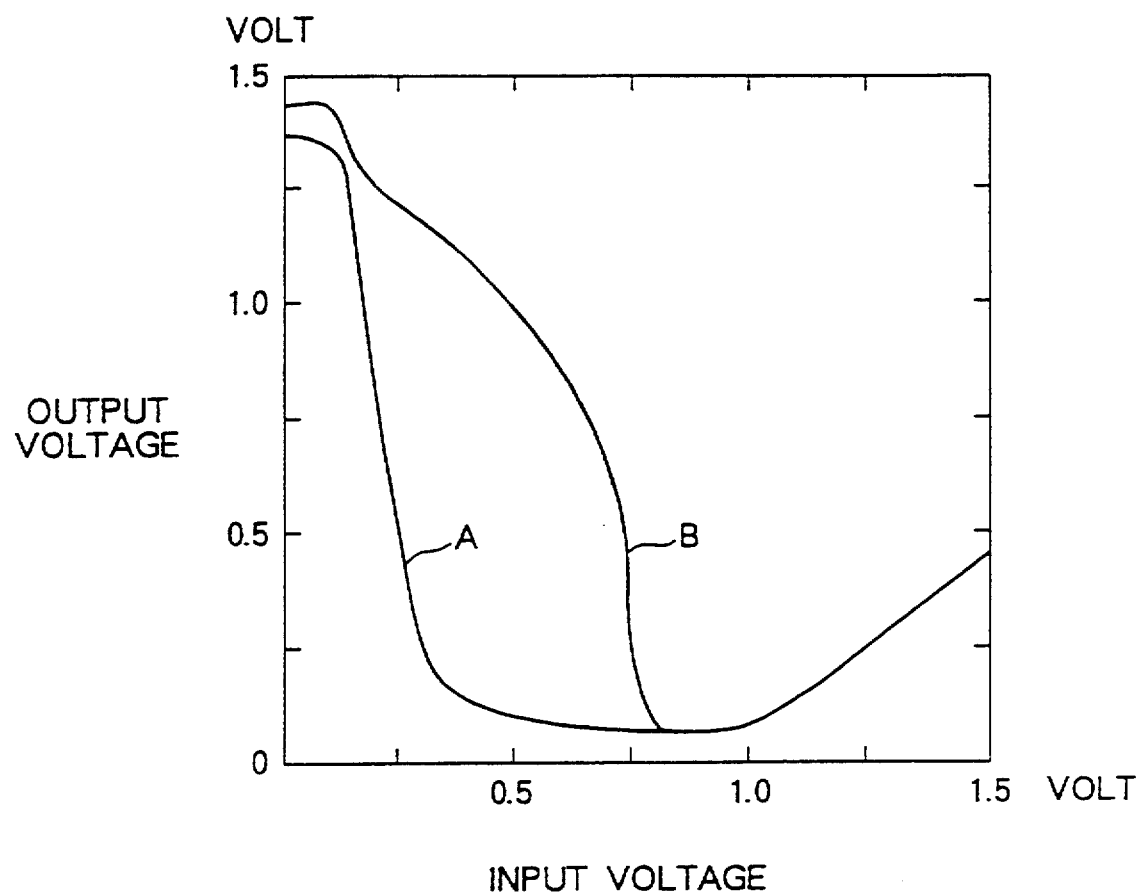
FIG. 6 is a graph showing the input-output characteristic of the inverter circuit of FIG. 5.

FIG. 6 shows the input-output characteristic of the inverter circuit 100 of FIG. 5, in which characteristic curve A was obtained while the input voltage fed to the input terminal 500 is increased from zero volts toward 2 volts, and in which characteristic curve B was obtained while the input voltage is decreased from 2 volts toward zero volts.

As is apparent from those characteristic curves, the inverter circuit 100 according to the present embodiment has an input-output characteristic exhibiting a hysteretic functions, i.e., the inverter circuit has two levels of outputs depending on the previous state of the circuit. Accordingly, the inverter circuit has a multivalued logic function.

Although the present invention is described by way of preferred embodiments thereof, the present invention is not limited to such embodiments and it will be obvious for those skilled in the art that various modifications or alterations can be easily made based on the above embodiments within the scope of the present invention.

What is claimed is:

1. A negative resistance circuit comprising:

first and second enhancement FETs each having a first electrode and a second electrode and a gate electrode controlling current flowing between said first and second electrodes, a conductivity type of said first enhancement FET being the same as a conductivity type of said second enhancement FET;

a load element having first and second ends, wherein said first end is connected to said first enhancement FET and said second end is connected to a first port of said negative resistance circuit, whereby said load element and said first enhancement FET form a first branch connected between said first port and a second port of said negative resistance circuit, said first and second electrodes of said second enhancement FET being connected between said first and second ports to form a second branch parallel to said first branch, said gate electrode of said second enhancement FET being connected to said second electrode of said first enhancement FET; and means for maintaining a constant voltage between said gate electrode of said first enhancement FET and said first port, said first and second ports receiving first and second voltages, wherein a current-voltage characteristic between said first port and said second port exhibits a negative resistance function.

2. A negative resistance circuit as defined in claim 1 wherein said gate electrode of said first enhancement FET is connected to a control port of said negative resistance circuit for controlling said current-voltage characteristic between said first port and said second port.

3. A negative resistance circuit as defined in claim 1 wherein each of said first and second enhancement FETs comprises an N-channel enhancement FET.

4. A negative resistance circuit as defined in claim 1, wherein said load element comprises a FET.

5. A negative resistance circuit as defined in claim 4 wherein said load element comprises a depletion mode load element.

6. An inverter circuit, comprising:

a negative resistance circuit including:
   first and second enhancement FETs each having a first electrode and a second electrode and a gate electrode controlling current flowing between said first and second electrodes, a conductivity type of said first enhancement FET being the same as a conductivity type of said second enhancement FET;

a load element having first and second ends wherein said first end is connected to said first enhancement FET and said second end is connected to a first port of said negative resistance circuit, whereby said load element and said first enhancement FET form a first branch connected between said first port and a second port of said negative resistance circuit, said first and second electrodes of said second enhancement FET being connected between said first and second ports to form a second branch parallel to said first branch, said gate electrode of said second enhancement FET being connected to said second electrode of said first enhancement FET; and means for maintaining a constant voltage between said gate electrode of said first enhancement FELT and said first port, and wherein said inverter circuit further comprises a third transistor having a first electrode and a second electrode and a control electrode controlling current flowing between said first and second electrodes, said first electrode of said third transistor being connected to said second port, said control electrode of said third transistor being connected to an input terminal of said inverter circuit, said second electrode of said third transistor being coupled to a first voltage, wherein said first port receives a second voltage higher than that of said first voltage, and wherein a current-voltage characteristic between said first port and said second port exhibits a negative resistance function.

7. A circuit comprising:

first and second enhancement FETs each having a first electrode and a second electrode and a gate electrode controlling current flowing between said first and second electrodes;

a load element having first and second ends, wherein said first end is connected to said first enhancement FET and said second end is connected to a first port of said negative resistance circuit, whereby said load element and said first enhancement FET form a first branch connected between said first port and a second port of said circuit, said first and second electrodes of said second enhancement FET being connected between said first and second ports to form a second branch parallel to said first branch, said gate electrode of said second enhancement FET being connected to said second electrode of said first enhancement FET; and means for maintaining a constant voltage between said gate electrode of said first enhancement FET and said first port, said first and second ports receiving first and second voltages, wherein a current-voltage characteristic between said first port and said second port exhibits a negative resistance function.

8. A circuit according to claim 7, wherein a conductivity type of said first enhancement FET is the same as a conductivity type of said second enhancement FET.

9. A circuit according to claim 7, wherein said gate electrode of said first enhancement FET is connected to a control port of said circuit for controlling said current-voltage characteristic between said first port and said second port.

10. A circuit according to claim 8, wherein each of said first and second enhancement FETs comprises an N-channel type enhancement FET.

11. A circuit according to claim 8, wherein said load element comprises a FET.

12. A circuit according to claim 11, wherein said load element comprises a depletion mode load element.

13. A circuit according to claim 1, wherein said first and second electrodes of said second FET are directly connected to the first and second ports.

14. A circuit according to claim 7, wherein said first and second electrodes of said second FET are directly connected to the first and second ports.

* * * * *

UNITED STATES PATENT AND TRADEMARK OFFICE
CERTIFICATE OF CORRECTION

Page 1 of 2

PATENT NO. : 5,537,076
DATED : July 16, 1996
INVENTOR(S) : Masahiro Fujii

It is certified that error appears in the above-identified patent and that said Letters Patent is hereby corrected as shown below:

Drawing:

Add Figure 6 as shown on the attached sheet.

Signed and Sealed this

First Day of October, 1996

*Attest:*

BRUCE LEHMAN

*Attesting Officer*  *Commissioner of Patents and Trademarks*